United States Patent [19]

Takishima

[11] Patent Number: 4,466,181
[45] Date of Patent: Aug. 21, 1984

[54] METHOD FOR MOUNTING CONJOINED DEVICES

[75] Inventor: Shoji Takishima, Tokyo, Japan
[73] Assignee: Clarion Co., Ltd., Tokyo, Japan
[21] Appl. No.: 446,346
[22] Filed: Dec. 2, 1982
[51] Int. Cl.³ .................. H01L 21/92; H01L 21/14
[52] U.S. Cl. .................................. 29/589; 357/75; 357/80
[58] Field of Search ............... 29/589, 591; 357/75, 357/80

[56] References Cited

U.S. PATENT DOCUMENTS 3,689,804  9/1972  Ishihama et al. .............. 357/80 X Primary Examiner—Brian E. Hearn
Assistant Examiner—Alan E. Schiavelli
Attorney, Agent, or Firm—Russell E. Hattis

[57] ABSTRACT

Method of manufacturing a semiconductive device which comprises: positioning plural semiconductive chips on a film so that one surfaces of the chips form a flat plane; connecting the semiconductive chips with insulative member to make one conjoined body; thereafter removing the film from the conjoined body; securing the conjoined body on a wiring board and forming metallic wires which connect the wiring board and the semiconductive chips in a manner that the wires be closely fit to the flat plane of the conjoined body.

3 Claims, 11 Drawing Figures

METHOD FOR MOUNTING CONJOINED DEVICES

BACKGROUND OF THE INVENTION

1. Field of the Invention

This invention relates to a semiconductive device in which many semiconductive chips can densely be mounted on one wiring board and to a manufacturing method of the same.

2. Description of the Prior Art

In the prior art, upon mounting semiconductive chips on a so-called wiring board which is made by providing wiring layers at desired positions on an insulative board, semiconductive chips 2a, 2b, 2c . . . are first located at positions on the wiring board 1, respectively, as shown in FIGS. 1 and 2, and thereafter, bonding pads 3a, 3b, 3c . . . provided at peripheries of the semiconductive chips 2a, 2b, 2c . . . are connected to wiring layers 4a, 4b, 4c on the wiring board by extremely thin wires (bonding wires) 5a, 5b, 5c . . . , respectively. The wiring layers 4a, 4b, 4c . . . are electrically connected to external terminals 6a, 6b, 6c . . . , respectively.

According to said prior art where the semiconductive chips are electrically connected to the wiring board by way of the extremely thin wires 5, possible mounting density of the semiconductive chips 2 on the wiring board 1 is limited due to areas necessary for bonding pads 3 and the wiring layers 4. Further, since the thin wires 5 extend on the board 1 and the chips 2 as if they float in the air, electrical characteristic of the semiconductive device sometimes deteriorates particularly in high frequency range. This is an important problem in semiconductive devices which need highly speedy actions.

OBJECT OF THE INVENTION

It is therefore an object of the present invention to overcome said problems in the prior art, by providing a semiconductive device and a manufacturing method in which semiconductive chips are first connected to each other by an insulative material so as to form one conjoined body with one plane of the conjoined body being flat, the conjoined body of the chips is next fixed on a wiring board, and finally, thin metallic lines are so formed to extend between the wiring board and each chip within the conjoined body.

SUMMARY OF THE INVENTION

In accordance with the present invention, there is provided a method of manufacturing a semiconductive device which comprises:

(A) positioning a plurality of semiconductive chips on a film so that respective one surfaces of said chips form a flat plane;

(B) making one conjoined body by connecting said semiconductive chips with insulative member filled between said semiconductive chips;

(C) removing said film from said conjoined body;

(D) securing said conjoined body on a wiring board with said flat plane of the conjoined body being faced upward; and (E) forming wires which connect wiring layers formed on said wiring board to bonding pads formed on said semiconductive chips or connect said bonding pads to each other in a manner that said wires closely fit on said flat plane.

DETAILED DESCRIPTION OF THE PREFERRED EMBODIMENTS

Figure 1:
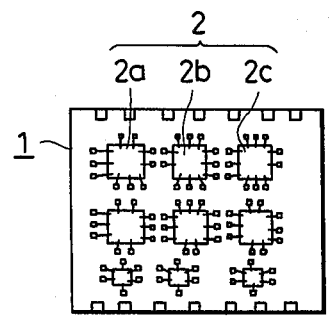
FIGS. 1 and 2 are a plan and a perspective view, respectively, of a prior-art semiconductive device.
Figure 2:
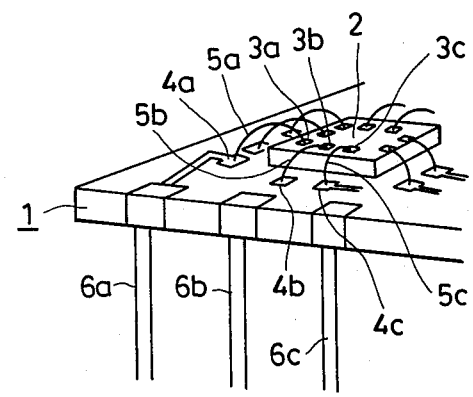

The present invention will now be described in detail by way of preferred embodiments of the manufacturing method referring to the drawings.

FIGS. 3(a) to 3(f) are sectional views illustrating the manufacturing steps.

Figure 3:
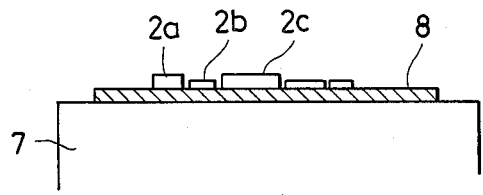
FIGS. 3(a) to 3(f) are sectional views showing manufacturing steps as being an embodiment according to the present invention.
Figure 3:
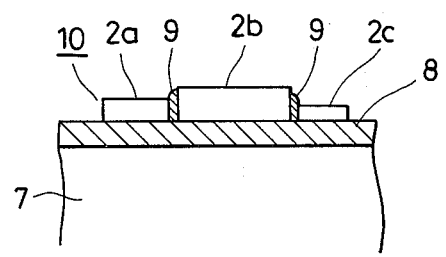
Figure 3:
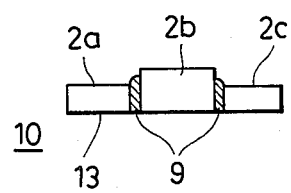

Step (a): As shown in FIG. 3(a), a close-fitting film 8 is deposited on a flat surface of a support plate 7. Semiconductive chips 2a, 2b, 2c . . . are so fixed on the film 8 that surfaces of the chips 2a, 2b, 2c . . . on which electrodes (including said bonding pads 3) are formed contact the film 8 and be aligned with each other. The semiconductive chips 2a, 2b, 2c . . . may be different in thickness.

Step (b): As shown in FIG. 3(b), gaps 50–60 μm wide, for example, between the semiconductive chips 2a, 2b, 2c . . . are filled with an insulative member 9 of epoxy resin, silicone resin, polyimide, for example. In this case, since the electrode-side surfaces of the semiconductive chips 2a, 2b, 2c . . . are closely fixed to the film 8, said resin never oozes onto the electrode-side surfaces. When the resin is hardened, a conjoined body 10 of the semiconductive chips 2a, 2b, 2c connected to each other by the insulative member 9 is obtained.

Step (c): As shown in FIG. 3(c), the conjoined body 10 is detached from the film 8.

Figure 3D:
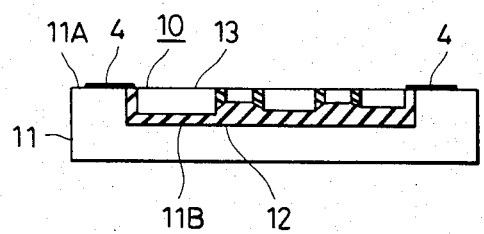

Step (d): As shown in FIG. 3(d), a wiring board 11 of ceramic, for example, is prepared. The wiring board 11 has a top surface 11A and a recess 11B. The conjoined body 10 is placed in the recess 11B through an insulative member 12 of epoxy resin, for example, with the electrode-side surfaces 13 being faced upward and being in alignment with the top surface 11A of the wiring board 11. On the top surface 11A of the wiring board 11 are formed wiring layers 4. When the resin is hardened, the conjoined body 10 is rigidly secured in the recess 11B.

Figure 3E:
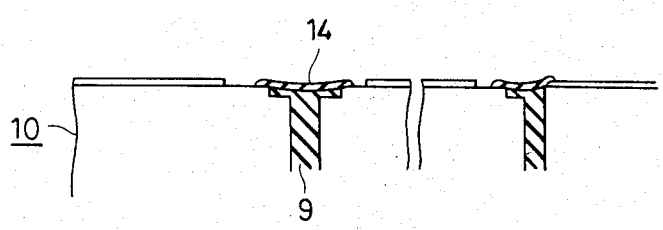

Step (e): As shown in FIG. 3(e), an insulative member 14, namely polyimide or cyclized butadiene rubber resin, is spread on the surface of the conjoined body 10. The insulative member 14 is thereafter partly removed by photolithographic method so as to remain only on the insulative member 9 in the gaps between the semiconductive chips 2a, 2b, 2c . . .

Figure 3F:
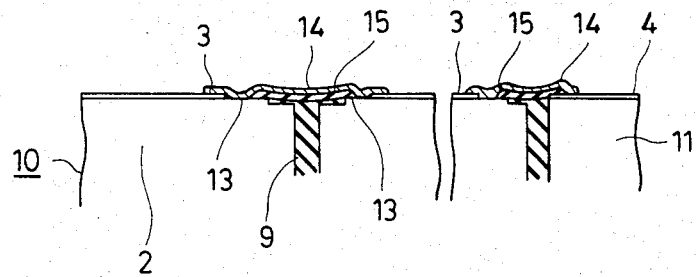
Figure 4A:
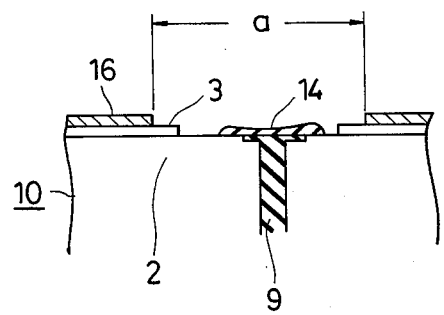
FIGS. 4(a) and 4(b) are sectional views showing manufacturing steps according to the present invention.
Figure 4B:
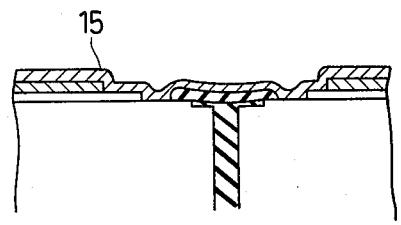

Step (f): As shown in FIG. 3(f), metallic wires 15 are formed so as to connect the bonding pads 3 on the semiconductive chips 2a, 2b, 2c . . . to the wiring layers 4 on the top surface 11A of the wiring board 11 or the bonding pads 3 to each other. The metallic wires 15 are so formed to closely fit on the electrode-side surfaces 13.

The metallic wires 15 may be formed, for example, by first spreading photoresist 16 on parts of the surfaces of the chips 2a, 2b, 2c . . . or the wiring board 11 except the parts for providing wires thereon, next depositing wiring metal 15 throughout the surfaces of the chips and the wiring board by vapour deposition, etc., and finally removing the photoresist 16 together with the metal 15 which is on the photoresist 16 to thereby leave only necessary parts of the 15 unremoved to form the wires 15.

The metallic wires 15 may also be formed by first depositing wiring metal 15 throughout the surface of the wiring board 11 and thereafter removing unnecessary parts by photolithographic method so as to leave only the wires 15 unremoved.

Figure 5:
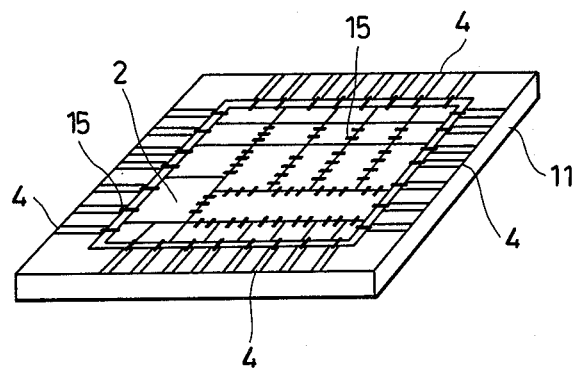
FIG. 5 is a perspective view of an embodiment of the semiconductive device according to the present invention.

Through said steps, the semiconductive device with the construction as shown in FIG. 5 can be obtained.

According to the present invention as described in the above, plural semiconductive chips are connected to each other by insulative member to form one conjoined body with one surface being flat and the conjoined body is rigidly fixed on a wiring board. Thereafter the metallic wires are so formed to extend between the surfaces of the wiring board and the chips. Therefore, length of the wires depends on preciseness of the photolithographic method. Practically, it may be 5 to 10μ approximately. This largely relaxes restriction in reduction of areas for connection between the bonding pads and the wiring layers, thereby permitting much more semiconductive chips to be mounted on a wiring board with the same size as a conventional one. Further, since the metallic wires never float in the air, bad influence to electric characteristic of the semiconductive device which has been involved in the prior art can be extremely reduced. Additionally, since the present invention does not require bonding with extremely fine wires, reliable electric connection can be expected.

I claim:

1. A method of mounting semiconductive chips having respective one surfaces with bonding pads formed thereon to a wiring board with wiring layers formed thereon, which method comprises:
   (A) positioning a plurality of semiconductive chips on a flat surface so that said respective one surfaces of said chips form a flat plane;
   (B) making one conjoined body by connecting said semiconductive chips with insulative member filled between said semiconductive chips;
   (C) removing said conjoined body from said flat surface;
   (D) securing said conjoined body on said wiring board with flat plane of the conjoined body being faced upward; and
   (E) forming wires which connect said wiring layers formed on said wiring board to said bonding pads formed on said semiconductive chips or connect said bonding pads to each other in a manner that said wires closely fit on said flat plane.

2. The method as claimed in claim 1 wherein, in said step (D), said wiring board includes a recess in a top surface and said conjoined body is fixedly positioned in said recess so that said flat plane of the conjoining body is substantially aligned with said top surface of said wiring board.

3. The method of claim 2 wherein said recess is initially at least partially filled with a hardenable material, said conjoined body is placed in said hardenable material so that the top surface thereof is exposed and aligned with said top surface of said wiring board and then said hardenable material is hardened to anchor said conjoined body therein.

* * * * *

UNITED STATES PATENT AND TRADEMARK OFFICE
CERTIFICATE OF CORRECTION

PATENT NO. : 4,466,181
DATED : August 21, 1984
INVENTOR(S) : Shoiji Takishima

It is certified that error appears in the above-identified patent and that said Letters Patent is hereby corrected as shown below:

On the title page insert:

-- /30/    Foreign Priority Data

December 4, 1981      Japan    195486  --.

Signed and Sealed this

Tenth Day of December 1985

[SEAL]

*Attest:*

DONALD J. QUIGG

*Attesting Officer*    *Commissioner of Patents and Trademarks*